United States Patent
Yang et al.

(10) Patent No.: US 9,239,757 B2
(45) Date of Patent: Jan. 19, 2016

(54) METHOD AND APPARATUS FOR RELOCATING DATA IN NON-VOLATILE MEMORY

(71) Applicant: SanDisk Technologies Inc., Plano, TX (US)

(72) Inventors: Niles Yang, Mountain View, CA (US); Jianmin Huang, San Carlos, CA (US); Ting Luo, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 64 days.

(21) Appl. No.: 14/292,372

(22) Filed: May 30, 2014

(65) Prior Publication Data
US 2015/0347228 A1    Dec. 3, 2015

(51) Int. Cl.
G11C 29/00    (2006.01)
G06F 11/10    (2006.01)
G11C 29/52    (2006.01)
G06F 11/07    (2006.01)
H03M 13/35    (2006.01)

(52) U.S. Cl.
CPC .......... G06F 11/1068 (2013.01); G06F 11/076 (2013.01); G06F 11/1072 (2013.01); G11C 29/52 (2013.01); H03M 13/35 (2013.01)

(58) Field of Classification Search
CPC ....... G11C 29/52; H03M 13/35; G06F 11/076
See application file for complete search history.

(56) References Cited

U.S. PATENT DOCUMENTS

| | | | | |
|---|---|---|---|---|
| 6,651,208 B1 * | 11/2003 | Tran | ................ | H03M 13/2909 714/755 |
| 6,675,349 B1 * | 1/2004 | Chen | ................... | H03M 13/11 714/758 |
| 6,738,947 B1 * | 5/2004 | Maeda | ............. | H03M 13/1515 714/785 |
| 6,907,559 B2 * | 6/2005 | Hall | ................... | G11B 20/1833 714/755 |
| 8,187,936 B2 | 5/2012 | Alsmeier et al. | | |
| 2005/0149833 A1 * | 7/2005 | Worley | ............... | H03M 13/19 714/781 |
| 2010/0064111 A1 * | 3/2010 | Kunimatsu | ............ | G06F 12/08 711/161 |
| 2011/0238899 A1 * | 9/2011 | Yano | .................. | G06F 12/0246 711/103 |
| 2012/0284587 A1 * | 11/2012 | Yu | ......................... | G06F 3/0608 714/773 |
| 2015/0106556 A1 * | 4/2015 | Yu | ......................... | G06F 3/0608 711/103 |
| 2015/0262714 A1 * | 9/2015 | Tuers | ............... | G11C 29/50004 714/721 |

OTHER PUBLICATIONS

Application as filed for U.S. Appl. No. 14/133,979, filed Dec. 19, 2013, 121 pages.
Application as filed for U.S. Appl. No. 14/136,103, filed Dec. 20, 2013, 56 pages.

(Continued)

*Primary Examiner* — M. Mujtaba K Chaudry
(74) *Attorney, Agent, or Firm* — Brinks Gilson & Lione

(57) ABSTRACT

Apparatus and methods implemented therein are disclosed for relocating data stored in pages of a non-volatile memory. The number of memory chunks with invalid data in an SLC type first page is determined and if the number is above a first threshold and above a second threshold, a bit error rate (BER) for the valid data in the set of memory chunks of the first page is compared with a first BER threshold. If the BER is below the first BER threshold, an error correcting code (ECC) for valid data in a set of memory chunks of a second page is computed and the invalid data of the first page with valid data is replaced with valid data from the second page and the computed ECC. The valid data of the first and second page is relocated to a third page.

20 Claims, 8 Drawing Sheets

(56) References Cited

OTHER PUBLICATIONS

Jang, J. et al.; "Vertical Cell Array using TCAT(Terabit Cell Array Transistor) Technology for Ultra High Density NAND Flash Memory"; 2009 *Symposium on VLSI Technology Digest of Technical Papers*; 2009; pp. 192-193.

Arya, P.; "A Survey of 3D Nand Flash Memory"; *EECS Int'l Graduate Program, National Chiao Tung University*; 2012; pp. 1-11; Hsinchu, Taiwan.

Nowak, E. et al.; "Intrinsic Fluctuations in Vertical NAND Flash Memories"; 2012 *Symposium on VLSI Technology Digest of Technical Papers*; 2012; pp. 21-22.

* cited by examiner

METHOD AND APPARATUS FOR RELOCATING DATA IN NON-VOLATILE MEMORY

TECHNICAL FIELD

This application relates generally to managing data in a memory system. More specifically, this application relates to relocating data from one memory block to another memory block in a solid state storage device based on determining if one or more criteria associated with the memory blocks are satisfied.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Non-volatile memory systems, such as flash memory, are used in digital computing systems as a means to store data and have been widely adopted for use in consumer products. Flash memory may be found in different forms, for example in the form of a portable memory card that can be carried between host devices or as a solid state disk (SSD) embedded in a host device. These memory systems typically work with memory units called memory chunks, pages and memory blocks.

For efficient functioning of non-volatile memory systems it is often desirable to relocate data stored in one memory unit to another memory unit. Current methods of relocating data from a memory unit do not take into consideration the state of the data stored in the memory unit. As a result, relocation is performed unintelligently and inefficiently.

SUMMARY

In order to address the need for improved reliability in an embedded flash memory device, methods, apparatuses and systems are disclosed herein for relocating data in a non-volatile memory system.

According to one aspect, a method is disclosed for relocating data in a memory system. In one embodiment, the memory system comprises a memory and a memory controller. The memory comprises a set of pages and each page comprises a set of memory chunks. The memory controller, in response to determining that a first page is an SLC type page, determines the number of memory chunks with invalid data in the first page. The memory controller in response to determining the number of memory chunks with invalid data in the first page is above a first threshold and above a second threshold, compares a bit error rate (BER) for the valid data in the set of memory chunks of the first page with a first BER threshold. In response to determining the BER is below the first BER threshold, the memory controller computes an error correcting code (ECC) for valid data in a set of memory chunks of a second page and replaces the invalid data of the first page with valid data from the second page and the computed ECC. The memory controller, without computing an ECC for valid data in the set of memory chunks of the first page, relocates the valid data of the second page and the valid data of the first page to a third page.

According to another aspect, an apparatus comprising a non-volatile memory and a memory controller is disclosed. The memory comprises a set of pages and a data latch. Each page comprises a set of memory chunks. The memory controller is electrically coupled to the memory and the memory controller comprises a processor, a random access memory (RAM) and an error correcting code (ECC) engine. The RAM is configured to store data and the ECC engine is configured to determine an ECC. The processor is configured to determine that a first page is an SLC type page, determine if a number of memory chunks with invalid data in the first page is above a first threshold and above a second threshold and compare a bit error rate (BER) for the valid data in the set of memory chunks with a first BER threshold; and if the BER is below the first BER threshold, the processor is configured to read the valid data and invalid data of the first page into the data latch, cause the ECC engine to compute an ECC for valid data of a second page and store the valid data of the second page in the RAM, replace the invalid data in the data latch with valid data from RAM and store the valid data from the data latch into a third page.

DETAILED DESCRIPTION

Figure 1:
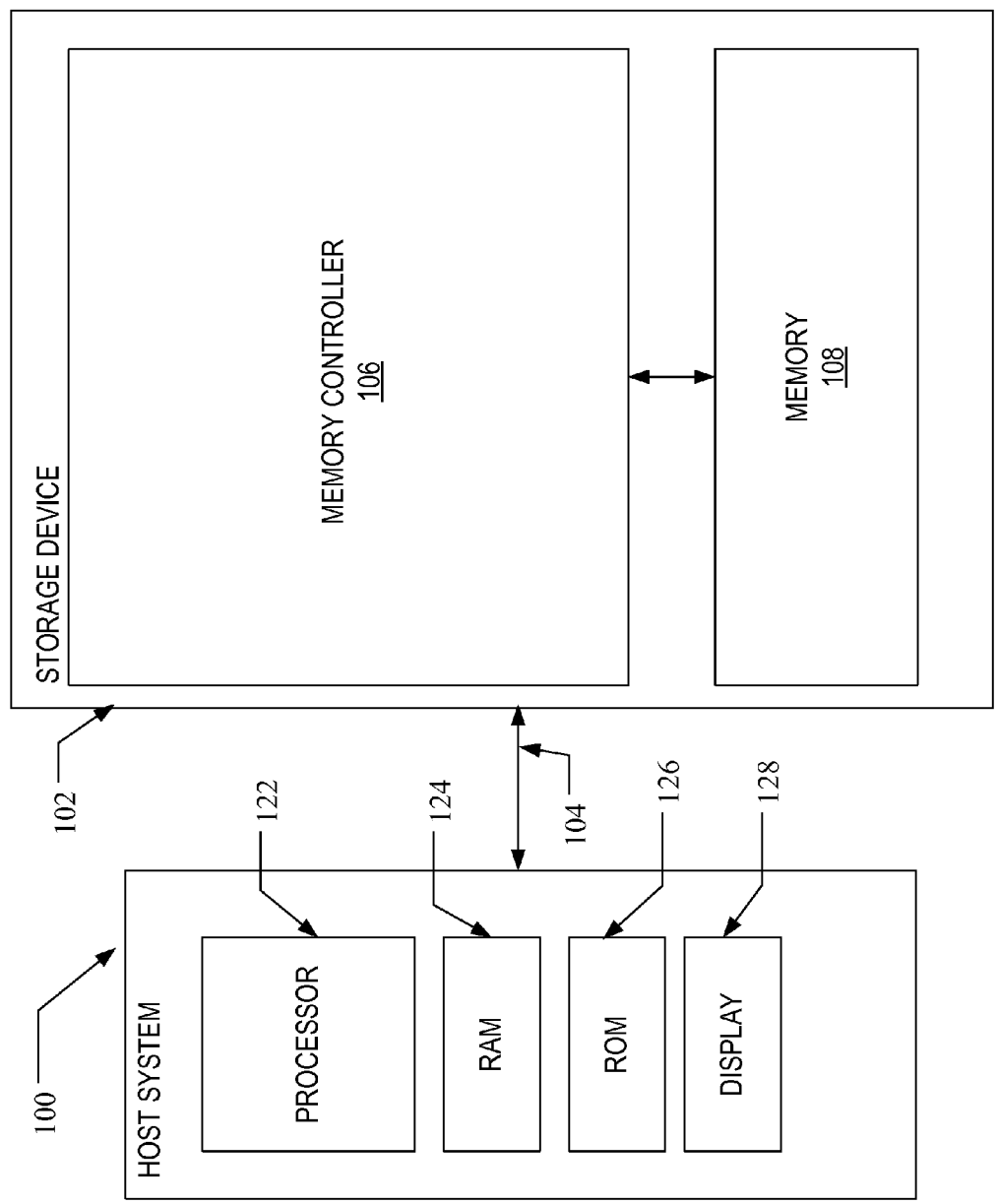
FIG. 1 illustrates a block diagram of host and storage device according to one embodiment.

A system suitable for use in implementing aspects of the invention is shown in FIG. 1. A host system 100 stores data into, and retrieves data from, a storage device 102. The storage device 102 may be referred to as a memory system. The storage device 102 may be embedded in the host system 100 or may exist in the form of a card or other removable drive, such as a solid state disk (SSD) that is removably connected to the host system 100 through a mechanical and electrical connector conforming to an appropriate standard such as e-MMC, PCMCIA, CompactFlash or other known connector formats. The host system 100 may be any of a number of fixed or portable data generating devices, such as a personal computer, a mobile telephone, a personal digital assistant (PDA), or the like. The host system 100 communicates with the storage device over an input/output interface 104.

In an embodiment, the storage device 102 comprises a memory controller 106 and a memory 108. Memory 108 may include semiconductor memory devices that store data. In an exemplary embodiment, methods implemented by the memory controller 106 may relocate data stored in the memory 108. The storage device 102 may be in the form of a portable flash drive, an integrated solid state drive or any of a number of known flash drive formats. In yet other embodiments, the storage device 102 may include only a single type of flash memory having one or more partitions.

Memory controller 106 operates to communicate data and program code back and forth between host system 100 and memory 108. The memory controller 106 may convert between logical addresses of data used by the host system 100 and physical addresses of memory 108 during programming and reading of data.

As discussed in more detail below, the storage device 102 may include functions for memory management. In operation, the processor 110 may execute memory management instructions for operation of memory management functions. The memory management functions may control the assignment of the one or more portions of the memory 108 within storage device 102. In a preferred embodiment, memory management functions also include relocating stored data between different portions of memory 108 in response to detecting one or more conditions.

Figure 2:
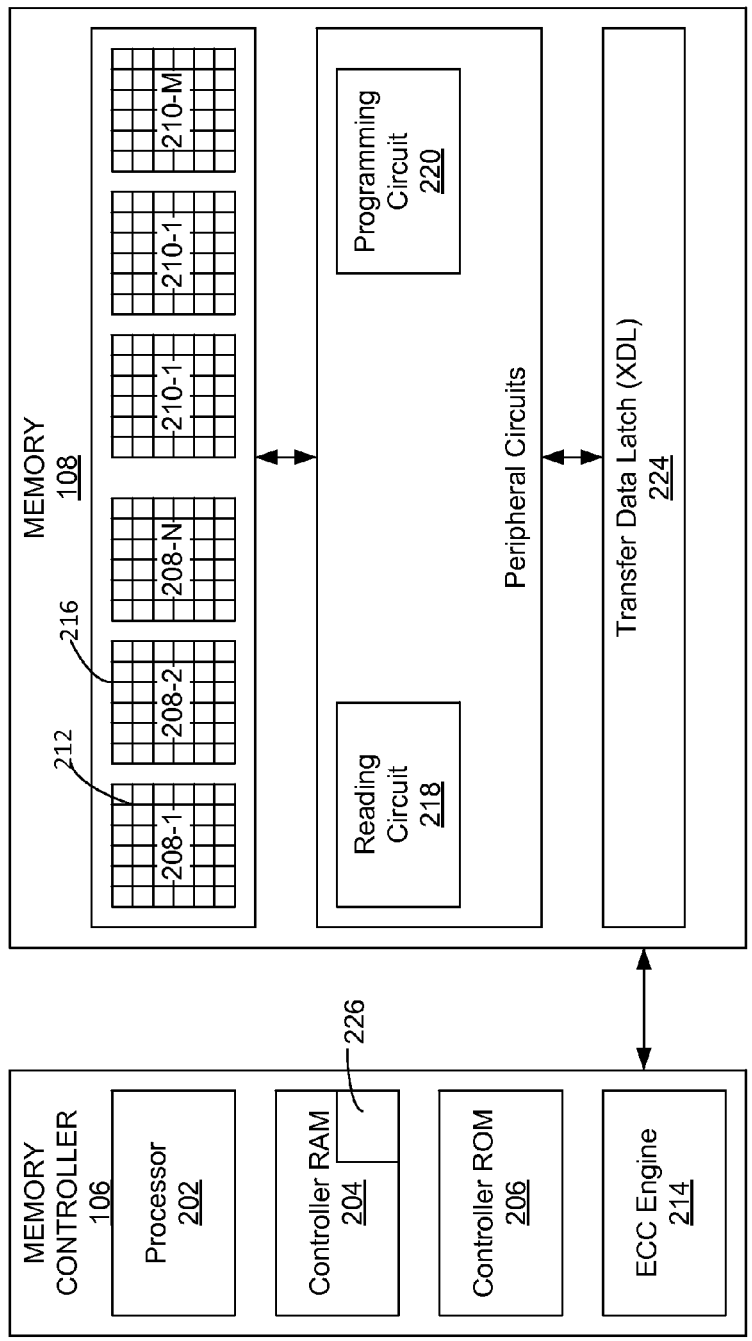
FIG. 2 is a block diagram of an example memory system/storage device that may implement data relocation methods described herein.

FIG. 2 is a detailed block diagram of an example memory system 102. In this embodiment, the example memory system 102 corresponds to the storage device 102 of FIG. 1. The memory system 102 comprises a memory controller 106 and memory 108. The memory controller 106 includes a processor 202, controller RAM 204, controller ROM 206 and error correcting code (ECC) engine 208, in this embodiment. The processor 202 may comprise a microprocessor, a microcontroller, an application specific integrated circuit (ASIC), a field programmable gate array, a logical digital circuit, or other now known or later developed logical processing capability. Controller ROM 206 may store software instructions that processor 202 may execute to control the operation of storage device 102 and perform the data relocation methods described herein.

Memory 108 may correspond to any solid state non-volatile memory. Non-volatile memory retains information stored therein even if the storage device 102 is powered down or disconnected from host 100. In an embodiment, memory 108 may be organized as a plurality of memory chunks. Data stored in a memory chunk may be referred to as a data chunk. In this embodiment, a memory chunk is a smallest unit of writing in the memory 108. NAND flash memory is one example of memory 108 that is organized as memory chunks. Each memory chunk may be made up of a number single-level cell (SLC) or multi-level cell (MLC). A SLC memory can store a single bit of data per cell. MLC memory can store multiple bits of data per cell. For example, two-level MLC memory can store 4 bits of data per cell, three level MLC memory can store 8 bits of data per cell and N level MLC memory can store $2^N$ bits of data per cell. Typical sizes of memory chunks are 4096 bytes or 4 Kilobytes (Kbytes). In describing exemplary embodiments herein, the term "cell" is used to refer to both SLC and MLC.

Both types of cells (SLC and MLC) store data by storing electric charge (charge). The amount of charge stored in a cell is representative of the data bit(s) stored in the cell. For example, where no charge is stored in an SLC, the charge value represents a bit value of 0. In contrast, a predefined amount of charge stored in an SLC, represents the bit value of 1. In the case of an N-level MLC, different amounts of charge may be stored to represent anyone of the $2^N$ bits of data. For example, a two-level MLC is configured to store any one of four amounts of charge ($2^2$=4).

In an embodiment, the reading circuit 218 of FIG. 2 translates the amount of charge stored in a cell to a binary representation of the data corresponding to the amount of charge stored in the cell. By way of example and without limitation, the reading circuit 218 may include current to voltage convertors, amplifiers and analog to digital convertors.

Memory chunks may be grouped to create physical pages (pages). Pages comprising memory chunks consisting of SLCs may be referred to as SLC type pages and pages comprising memory chunks consisting of MLCs may be referred to as MLC type pages. For example, four memory chunks may be grouped together to form a page. Based on a 4 Kbytes memory chunk size, the size of a page comprising four memory chunks is 16 Kbytes. Pages may be grouped together to form a physical memory block. A memory block consisting of SLC type pages may be referred to as an SLC memory block. A memory block consisting of MLC type pages may be referred to as an MLC memory block. For example, sixteen 16 Kbytes pages may be grouped to create a 256 Kilobytes memory block. Referring to FIG. 2, memory 108 comprises N number of SLC memory blocks, 208-1 to 208-N and M number of MLC memory blocks, 210-1 to 201-M. In other embodiments, memory 102 may comprise only SLC memory blocks or only MLC memory blocks. The memory chunks that comprise the blocks are illustrated as small boxes in block 208-1 . . . 208-N and 210-1-210-M. As an example, 212 is a memory chunk of memory block 208-1. Each row of memory chunks in a memory block represents a page.

Memory 108 also includes a programming circuit 220, a reading circuit 218 and transfer data latch (XDL) 224. The XDL 224 functions as intermediate data storage between memory controller 106 and memory 108. When instructed by host 100 to write data to memory 108, memory controller 106 writes data to XDL 224. The programming circuit 220 then writes the data from XDL 224 to the specified memory block and page. By way of example and without limitation, the size of the XDL is equal to the size of a page. Similarly, when instructed to read data from a specified memory chunk or page, reading circuit 218 reads data from the specified memory chunk or page into the XDL 224 and memory controller 106 transfers the read data from the XDL 224 to controller RAM 204.

Generally writing data to a SLC memory block takes less time than writing the same data to an MLC memory block. However, an MLC memory block has a higher density than an SLC memory block. To take advantage of the speed of SLC and density of MLC, memory 108 may consist of both SLC memory blocks and MLC memory blocks, as is the case of the memory 108 of FIG. 2. Where memory 108 consists of both SLC memory blocks and MLC memory blocks, it may be desirable to first store data into an SLC memory block and then subsequently move the data to a MLC memory block. Moving data from SLC memory blocks to MLC memory blocks may be performed by processor 202 either as a background operation or when storage device 102 is idle (i.e. not being accessed by host system 100). In a preferred embodiment, movement of the data between blocks may be performed in accordance with methods or combination of methods described herewith.

After a memory chunk in a memory block is written to with data, all memory chunks in the memory block must be erased before processor 202 can write data to the memory chunk. For example, if data is written to memory chunk 212, block 208-1 must be erased before memory chunk 212 can be written to again.

In an embodiment, the memory controller 106 maintains a logical to physical address table 226 in controller RAM 204. An entry in the table 226 includes a reference to a memory chunk. Thus, the logical to physical address table 226 may comprise an array of references to memory chunks. One format of an entry in the table may comprise a reference to the memory block associated with the memory chunk and an index of the memory chunk in the memory block. As an example, a reference to memory chunk 212 may comprise a reference to memory block 208-1 and the index of memory chunk 212 in memory block 208-1.

The host system 100 when requesting a write of a data chunk specifies a logical address. In response to receiving a request from host system 100 to write data to a logical address, processor 202 may utilize the logical address as an index into the logical to physical address table 226 and identify the memory chunk and the memory block corresponding to the logical address. The processor 202 may determine if the identified memory chunk is already written to (old memory chunk). In response to determining that the memory chunk is already written to, processor 202 may locate a new memory chunk that has not been written to and write the received data to the new memory chunk and mark the old memory chunk as invalid. Separately, processor 202 may update the entry in the logical to physical address table 226 corresponding to the logical address with a reference to the new memory chunk and a reference to the block associated with the new page.

As an example, in response to receiving a request from host system 102 to write data to a logical address that references memory chunk 212 and memory block 208-1, processor 202 may determine if memory chunk 212 had been previously written to. In response to determining that memory chunk 212 had been previously written to, processor 202 may locate a memory chunk 216 that has not been written to and write the date received from host processor 202 to memory chunk 216. A memory chunk with invalid data may be referred to as an invalid memory chunk and the data in the invalid memory chunk may be referred to as an invalid data or an invalid data chunk. Processor 212 may mark memory chunk 212 as invalid and update the entry in the logical to physical address table 226 corresponding to the logical address with a reference to memory chunk 216. If however processor 202 determines that memory chunk 212 was not previously written to, processor 202 may write the data to memory chunk 212. In an exemplary embodiment, processor 202 may monitor the number of invalid memory chunks in a page. In response to determining that the number of invalid memory chunks in a page exceeds a threshold, processor 202 may copy the valid data from all of the valid memory chunks out of the page (source page) to unwritten or erased memory chunks associated with a new physical page (destination page). The source page and destination page may be in the same memory block or in different memory blocks. Processor 202 may then update those entries in the logical to physical address table 226 that were associated with the memory chunks from where data was copied with references to memory chunks where the data were copied. Of course, in other embodiments, the processor 202 may compare the number of invalid memory chunks in a memory block with a threshold.

Additionally, in response to detecting errors in the data stored in a memory chunk of a page, processor 202 may move all the data from the page to another page. Errors are introduced because of the structure of the SLC and MLC. As previously explained, SLC and MLC store data by storing electric charge. Over time, it is not uncommon for the charge in a cell to dissipate or for the cell itself to deteriorate, whereby the data stored in the cell may no longer be correct. When the charge in the cell dissipates, the charge level in the cell no longer corresponds to the data (bit(s)) that was initially store in the cell. As a result the data in the cell is no longer correct. The bit is said to be in error. As more and more cells in a memory chunk dissipate their stored charge, the number of bits in error in the memory chunk increases.

An error correction code (ECC) may be implemented to identify and correct errors in the data of a memory chunk. When writing data to a memory chunk, processor 202 may cause the calculation of an error correcting code (ECC). The calculated ECC may be written to the memory chunk along with the data. Calculation of the ECC may be performed by error correcting code (ECC) engine 214. An example ECC is the low-density parity-check code (LDPC). Separately, ECC engine 214 may compute the ECC for data in a memory chunk whenever the data in the memory chunk is read out by memory controller 106. The memory controller 106 may read out the data from the memory chunk in response to receiving a request from host 100. The ECC engine 214 may compare the computed ECC with the ECC that was stored in the memory chunk when the data was written to the memory chunk. Generally, if the number of bits in error or the bit error rate (BER) of the data of a memory chunk is below a threshold, the ECC engine 214 may utilize the ECC stored with the data to recover the bits in error. In an exemplary embodiment, the memory controller 106 may behave in one of several ways based on the magnitude of the difference between the computed ECC and the ECC that was stored in the memory chunk when the data was written to the memory chunk. If the difference in the two ECCs is below a first threshold or a first bit error rate (BER), the ECC engine 214 may not take any action. If the difference in the ECCs is above the first BER, the ECC engine 214 may use the ECC code stored with the block to recover the bits in error and write the corrected data back to a new memory chunk.

Figure 3A:
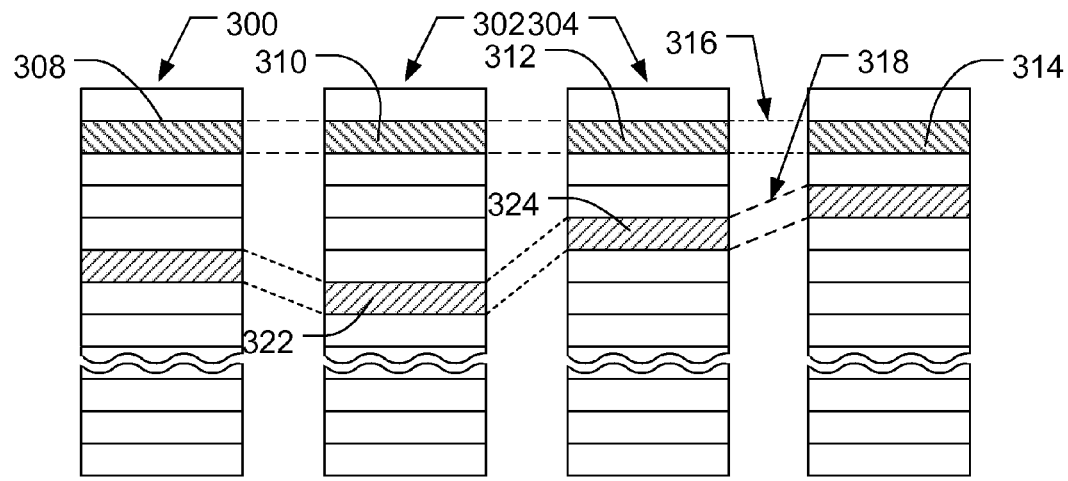
FIG. 3A illustrates an example physical memory organization of the memory in the storage device of FIG. 1.

Referring to FIG. 3A, memory 108 (e.g. SLC and MLC flash respectively) may be arranged in blocks of memory cells. In the example of FIG. 3A, four planes or sub-arrays 300, 302, 304 and 306 memory cells are shown that may be on a single integrated memory cell chip, on two chips (two of the planes on each chip) or on four separate chips. The specific arrangement is not important to the discussion below and other numbers of planes may exist in a system. The planes are individually divided into pages shown in FIG. 3A by rectangles, such as pages 308, 310, 312 and 314, located in respective planes 300, 302, 304 and 306. There may be dozens or hundreds of blocks in each plane. Pages may be logically linked together to form a memory block that may be erased as a single unit. For example, pages 308, 310, 312 and 314 may form a first memory block 316. The pages used to form a memory block need not be restricted to the same relative locations within their respective planes, as is shown in the second memory block 318 made up of pages 320, 322, 224 and 226.

Figure 3B:
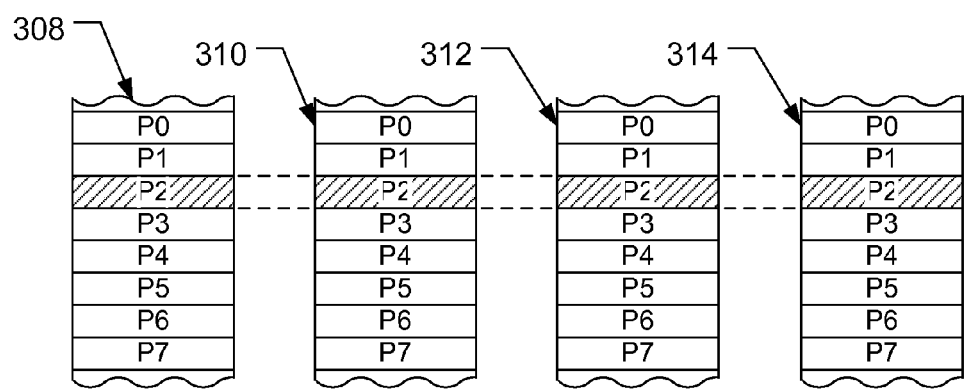
FIG. 3B shows an expanded view of a portion of the physical memory of FIG. 2.

As previously discussed, the individual pages are in turn divided for operational purposes into memory chunks of memory cells, as illustrated in FIG. 3B. The memory cells may be SLC or MLC type cells. The memory chunks of each of pages 308, 310, 312 and 314, for example, are each divided into eight chunks P0-P7. Alternately, there may be 16, 32 or more memory chunks of memory cells within each block. A memory chunk is the unit of data programming and reading within a page, containing the minimum amount of data that are programmed or read at one time. A memory plane 302 is illustrated in FIG. 3B is formed of one physical page for each of the four pages 308, 310, 312 and 314. The memory blocks disclosed in FIGS. 3A-3B are referred to herein as physical blocks because they relate to groups of physical memory cells as discussed above. As previously discussed and as used herein, a logical block is a virtual unit of address space defined to have the same size as a page. Each logical block includes a range of logical block addresses (LBAs) that are associated with data received from a host 100. The LBAs are then mapped to one or more memory chunks in the storage device 102 where the data is physically stored.

Next discussed are several methods of relocating data from one page (source page) to another page (destination page) of a memory, memory 108 for example. The methods discussed may be implemented in the storage device 102 (FIG. 1). By way of example and without limitation, in the discussed methods, the source page and destination page are located in different memory blocks. In other embodiments, the source and destination pages may be located in the same memory block.

Figure 4:
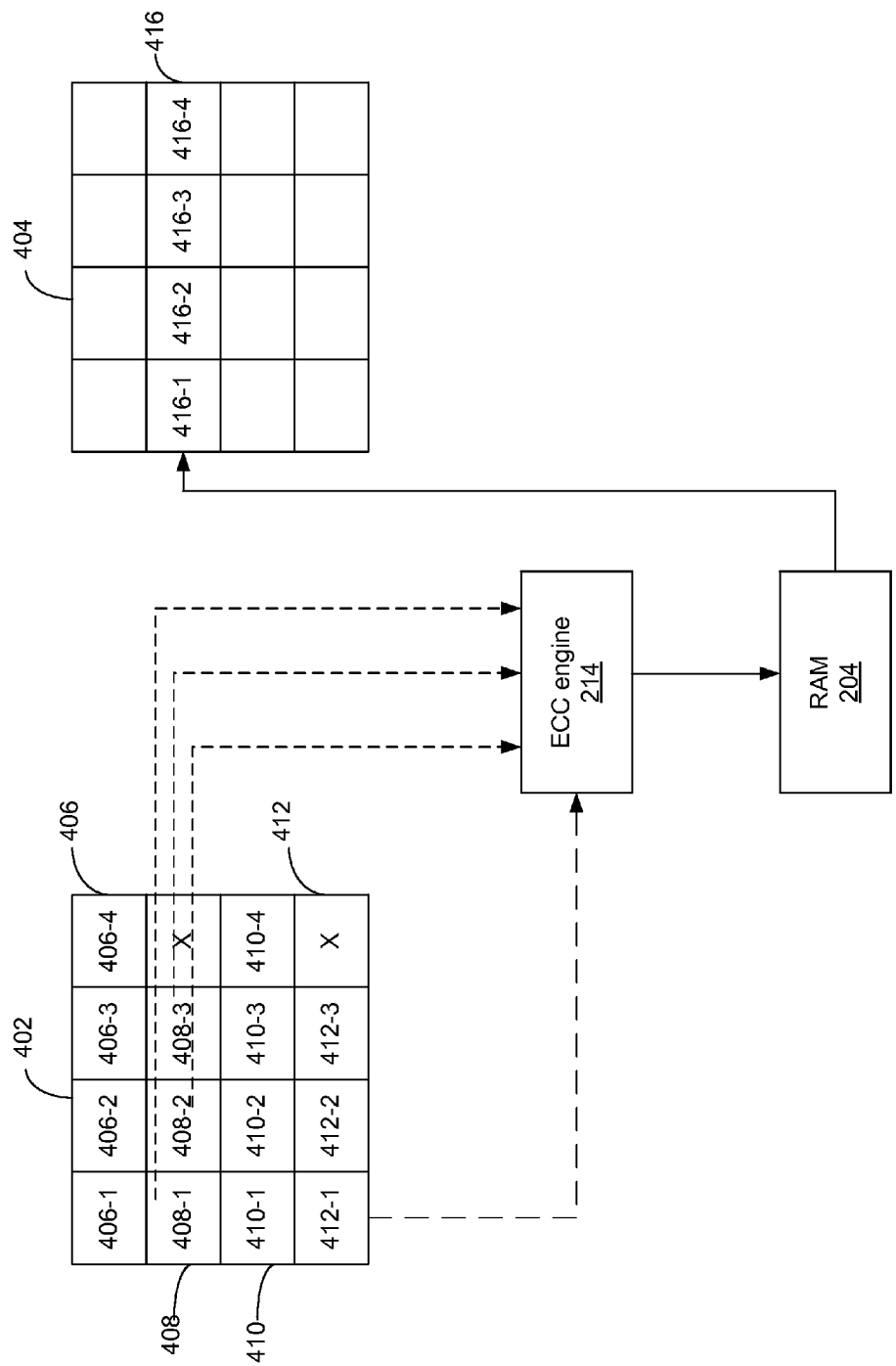
FIG. 4 illustrates one method for relocation of data stored in memory chunks of a source memory block to memory chunks of memory block of a destination memory block that may be implemented in the memory system of FIG. 2.

FIG. 4 illustrates one method for relocation of data stored in memory chunks of memory block 402 (source memory block) to memory chunks of memory block 404 (destination memory block). In a preferred embodiment, the relocation may be implemented in memory controller 106 (FIG. 2). Memory blocks 402 and 404 may be SLC type memory blocks or MLC type memory blocks. Memory blocks 402 and 404 are comprised of 16 memory chunks (each small box represents a memory chunk). Each row of memory chunks in memory blocks 402 and 404 represents a page. For example, memory block 402 comprises pages 406, 408, 410 and 412. In an embodiment, the decision to relocate the data from memory block 402 to 404 may be in response to determining that a threshold number of memory chunks in a page of memory block 402 contain invalid data. In the example of FIG. 4, the threshold number is 1. As depicted in FIG. 4, memory chunks of memory block 402 marked with an 'X' contain invalid data.

Memory controller 106 of FIG. 2 may read the valid data from memory chunks 408-1, 408-2 and 408-3 of page 408 into controller RAM 204. In an embodiment, processor 202 may instruct the reading circuit 218 to read data stored in page 408. The reading circuit 218 may transfer the data from page 408 to transfer data latch (XDL) 224 and transmit an indication to processor 202. Processor 202 may read the data from XDL 224 to controller RAM 204. Before the data is transferred to controller RAM 204, ECC engine 214 of FIG. 2, for example, may compute an ECC for the valid data contained in each of the memory chunks 408-1, 408-2 and 408-3. The computed ECC for the data contained in each of the memory chunks may be appended to the corresponding data.

Processor 202 may identify the data corresponding to memory chunks marked as invalid in page 408. Processor 202 may overwrite the invalid data with data from valid memory chunks from other pages. In the example depicted in FIG. 4, processor 202 may read valid data from memory chunk 412-1 of page 412, for example, and overwrite the invalid data of page 408 with the valid data from memory chunk 412-1. Before overwriting the data, ECC engine 214 may compute an ECC for the valid data from memory chunk 412-1.

Processor 202 may copy the valid data for memory chunks 408-1, 408-2, 408-3 and 412-1 from controller RAM 406 to page 416 of block 404. For example, valid data from memory chunk 408-1 may be relocated to memory chunk 416-1, valid data from memory chunk 408-2 may be relocated to memory chunk 416-2, valid data from memory chunk 408-3 may be relocated to memory chunk 416-3 and valid data from memory chunk 412-1 may be relocated to memory chunk 416-4. By way of example and without limitation, in the foregoing discussion, the pages 408 and 412 are located in the same source memory block 402. In other embodiments, the pages 408 and 412 may be located in different source memory blocks. Because all data relocated from a source memory block to a destination memory block is copied through memory controller 206 components controller RAM 204 and ECC engine 214, the method described with reference to FIG. 4 may be referred to as copy through controller (CTC).

Figure 5:
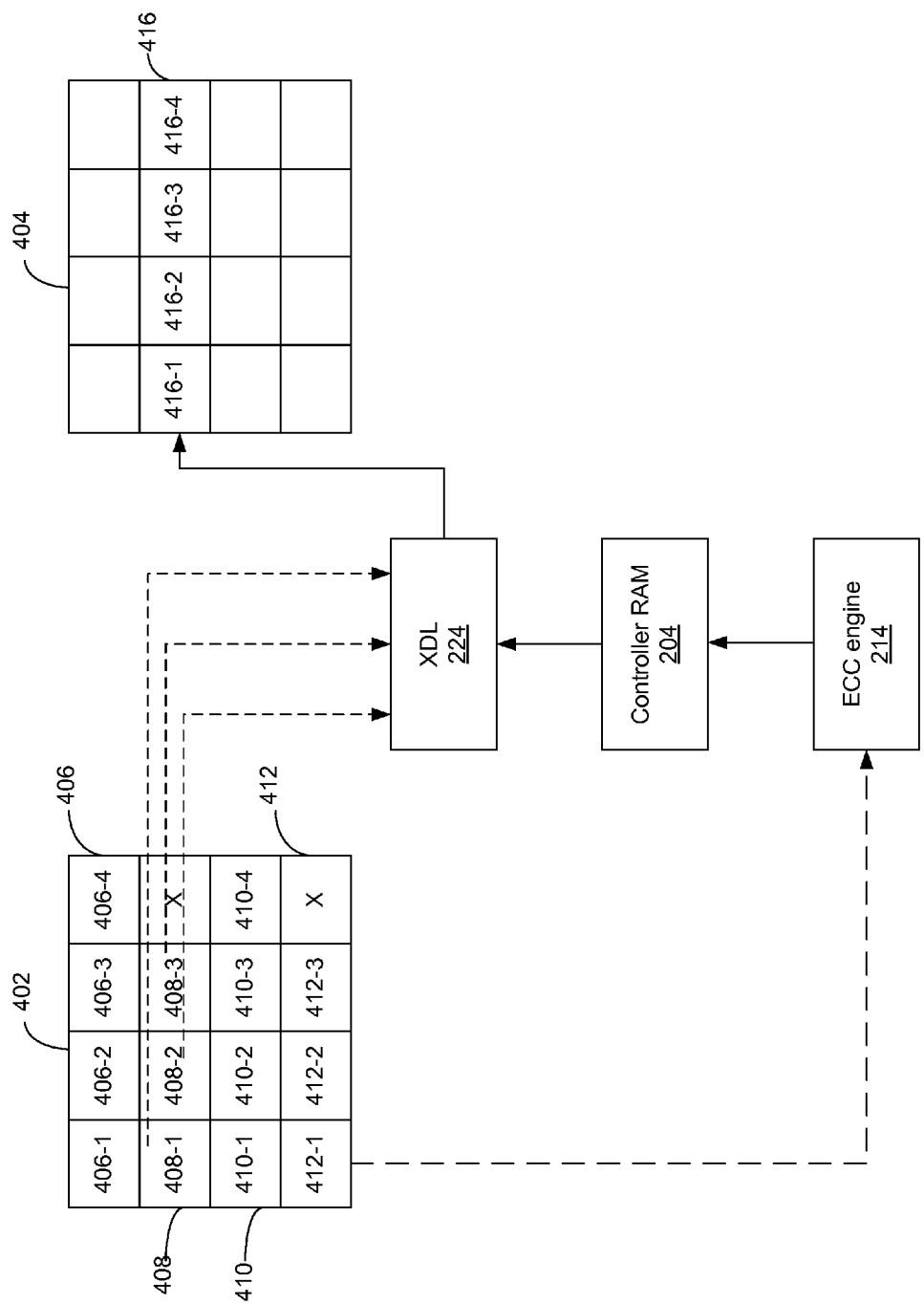
FIG. 5 illustrates another method for relocation of data stored in memory chunks of a source memory block to memory chunks of memory block of a destination memory block that may be implemented in the memory system of FIG. 2.

FIG. 5 illustrates another method that memory controller 106 may implement for relocating data from memory chunks from several pages of a source memory block to memory chunks of a page of a destination memory block. In this example method, memory controller 106 may identity a page based on the number of invalid memory chunks in the page. After identifying a page, example 408, processor 202 may execute instructions stored in controller ROM 206 to cause the reading circuit 218 to read data from memory chunks 408-1, 408-2, 408-3 and the invalid data from invalid memory chunk 408-4 into the transfer data latch 224.

Separately, processor 202 may identify in another page a memory chunk containing valid data, for example memory chunk 412-1 in page 412. Memory chunk 412-1 may be identified based the difference between a computed ECC for the data in memory chunk 412-1 and the ECC stored with the data which was computed when the data was originally written to memory. For example, based on the difference, the processor 202 may conclude that any further errors in the data in the memory chunk 412-1 may prevent recovery of the bit in error. In response, processor 202 may read the data stored in memory chunk 412-1 and instruct the ECC engine 214 to recover any bit in error in the data. As previously explained, ECC engine 214 may use the ECC stored with the data to recover the bit in error and correct the errors in the data stored in the memory chink 412-1. This error-corrected data may then be stored in controller RAM 204. Processor 202 may execute instructions to replace the invalid data from the invalid memory chunk 408-4 in the transfer data latch 224 with the error-corrected data from controller RAM 204. After the replacement, XDL 224 may contain data from memory chunks 408-1, 408-2 and 408-3 and error corrected data from memory chunk 412-1. Processor 202 may cause the data contained in XDL 224 to be stored to the memory chunks 416-1, 416-2, 416-3 and 416-4 of page 416.

In the preceding discussion, memory controller 106 utilizes the XDL 224 of memory 108 as an intermediate memory location to effectuate the merging of error-corrected valid data from memory chunks from one page with the valid data from memory chunks of a second page. Other embodiments are contemplated where in place of XDL 224, an intermediate non-volatile memory device, conforming for example to a shared memory model between memory 108 and memory controller 106, may be used to perform the above described merging of valid data from different memory chunks. The method of relocation described above may be referred to a "hybrid copy through controller (CTC)" because only some of the memory chunks are copied into controller RAM 204 and subject to ECC verification by ECC engine 214 instead of all the memory chunks as detailed with respect to the FIG. 4.

Figure 6:
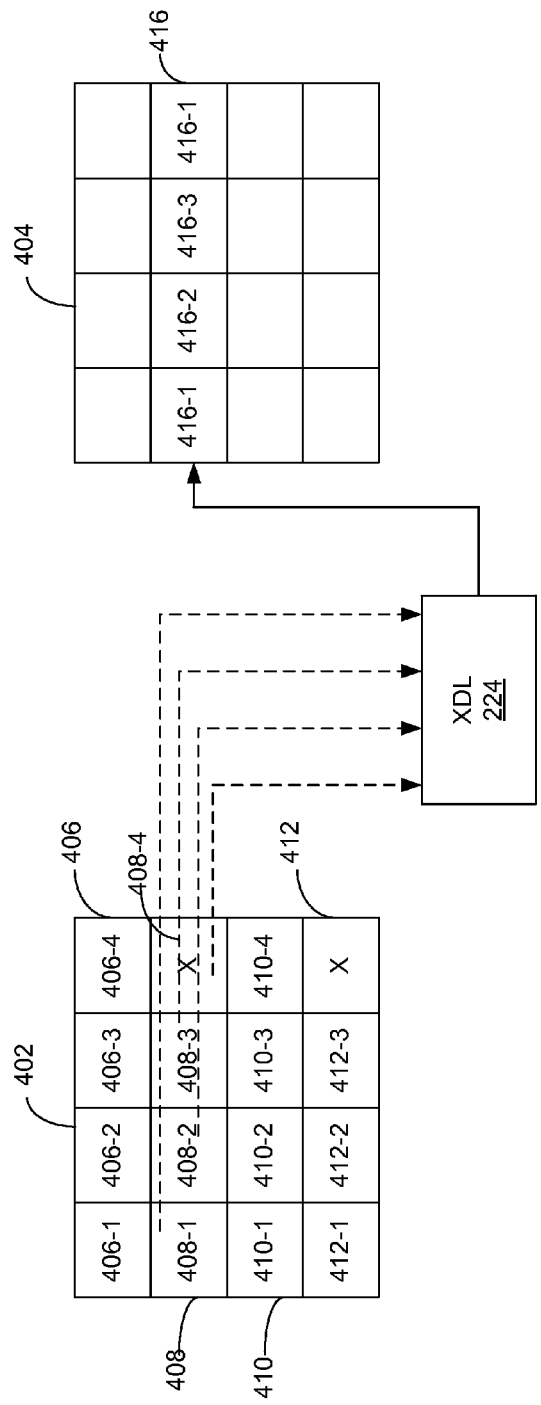
FIG. 6 illustrates yet another method for relocation of data stored in memory chunks of a source memory block to memory chunks of memory block of a destination memory block that may be implemented in the memory system of FIG. 2.

FIG. 6 is yet another method that may be implemented by memory controller 106 for relocating data from memory chunks in a source memory block to memory chunks in a destination memory block. In the example depicted in FIG. 6, processor 202 may execute instructions stored in controller ROM 206 to cause the reading circuit 218 to read data from memory chunks 408-1, 408-2, 408-3 and the invalid data from invalid memory chunk 408-4 into the transfer data latch 224. Memory controller 106 may determine that the memory chunks in page 416 of memory block 404 do not contain valid data and are erased. Memory controller 106 may cause the programming circuit 220 to write the data in the XDL 224 to the memory chunks 416-1 to 416-4 of page 416. In the example, data from the source memory chunks i.e. 408-1 to 408-4 are not copied to controller RAM. Also, an ECC is not recomputed for the data. This method of relocating data may be referred to as on chip copy (OCC). OCC may be implemented to relocate data from MLC memory blocks to MLC memory blocks or SLC memory blocks to MLC memory blocks. For example, memory block 402 of FIG. 6 may consist of SLC memory and memory block 404 may consist of MLC memory. As previously explained, writing to SLC memory is faster (low latency). Memory controller 106 may write data to memory block 402 to take advantage of the low latency write characteristics of SLC and then as a background operation relocate the data from memory block 402 to memory block 404 when storage device 102 is idle.

Figure 7:
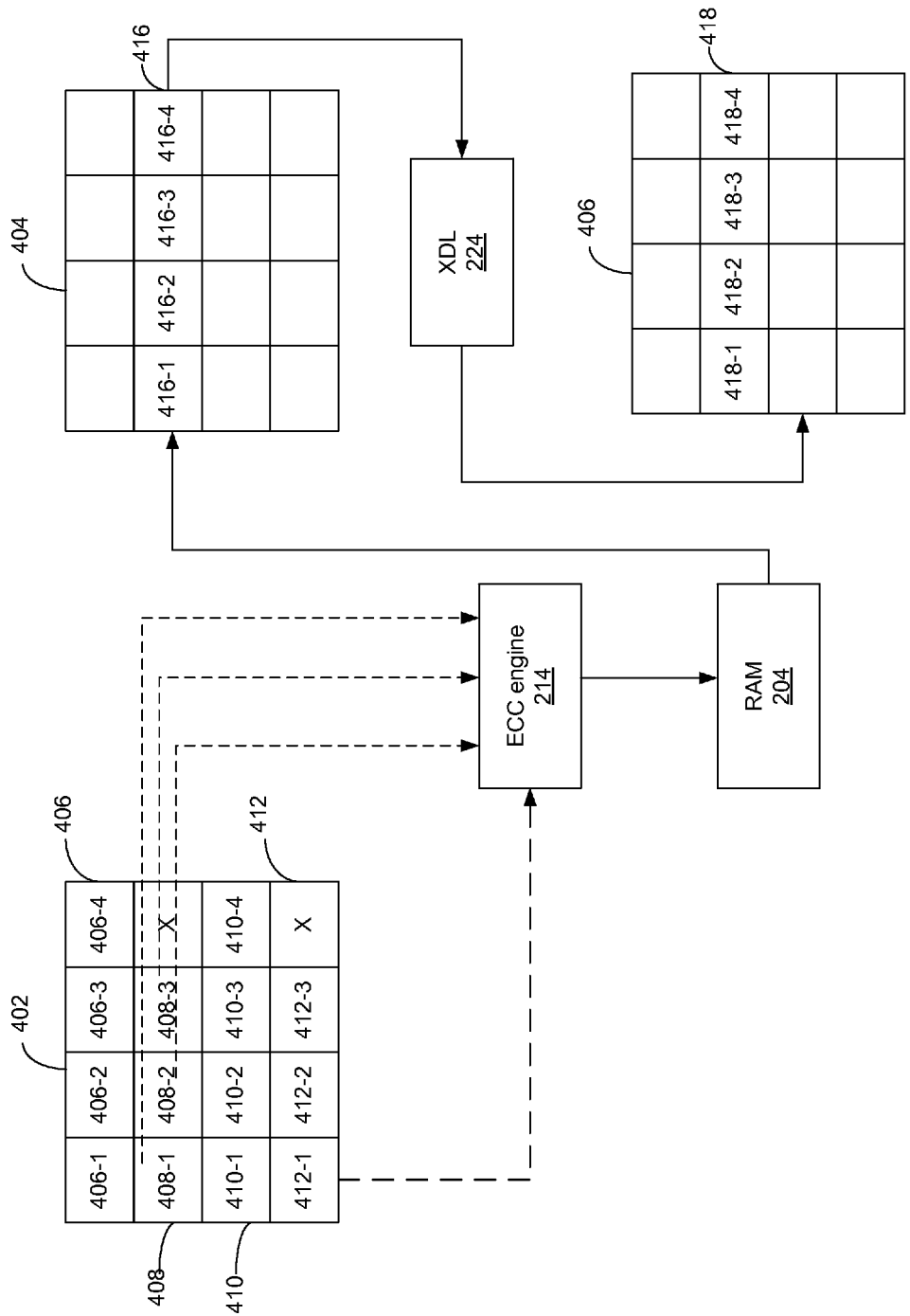
FIG. 7 illustrates still another method for relocation of data stored in memory chunks of a source memory block to memory chunks of memory block of a destination memory block that may be implemented in the memory system of FIG. 2.

FIG. 7 depicts still another method that may be implemented by memory controller 106 for relocating data from memory chunks from several pages in a source memory block to memory chunks of another page in a destination memory block. In this method, data from memory chunks from a source memory block are relocated to memory chunks of an intermediate memory block using the method described with reference to FIG. 4, i.e. copy through controller. The data from the memory chunks in the intermediate memory block may then be relocated to the memory chunks of the destination memory block using the OCC method described with respect to FIG. 6.

As depicted in FIG. 7 after relocating data from memory chunks of pages 408 and 412 of memory block 402 to memory chunks of page 416 of intermediate memory block 404, memory controller 106 may implement the on-chip copy (OCC) method detailed with respect to FIG. 6 to relocate data from memory chunks to memory chunks of page 418 of destination memory block 418. In an embodiment, destination memory block 406 may consist of MLC type memory. The method of relocating data from a source memory block 402 to a destination memory block 406 via an intermediate memory block 404 using copy through controller (CTC) from source memory block 402 to intermediate memory block 404 and OCC from intermediate memory block 404 to destination memory block 406 may be referred to as a combined CTC-OCC relocation method.

In the preceding discussion of the various methods for relocation of data in memory 108, it is contemplated that data from memory chunks from different pages may be merged using anyone of the above described methods and relocated to a new page. For example, with reference to FIG. 4, data from memory chunks 408-1, 408-2, 410-1 and 412-1 may be relocated to page 416. Relocating data from memory chunks from different pages to a single page may be particularly useful when the data stored in memory chunks 408-1, 408-2, 410-1 and 412-1 corresponds to contiguous host system 100 data. Embodiments are also contemplated where data from memory chunks of pages located in different source memory blocks may be relocated to memory chunks of a page of a destination memory block using any one of the methods described with respect to FIG. 4 through FIG. 7.

Figure 8:
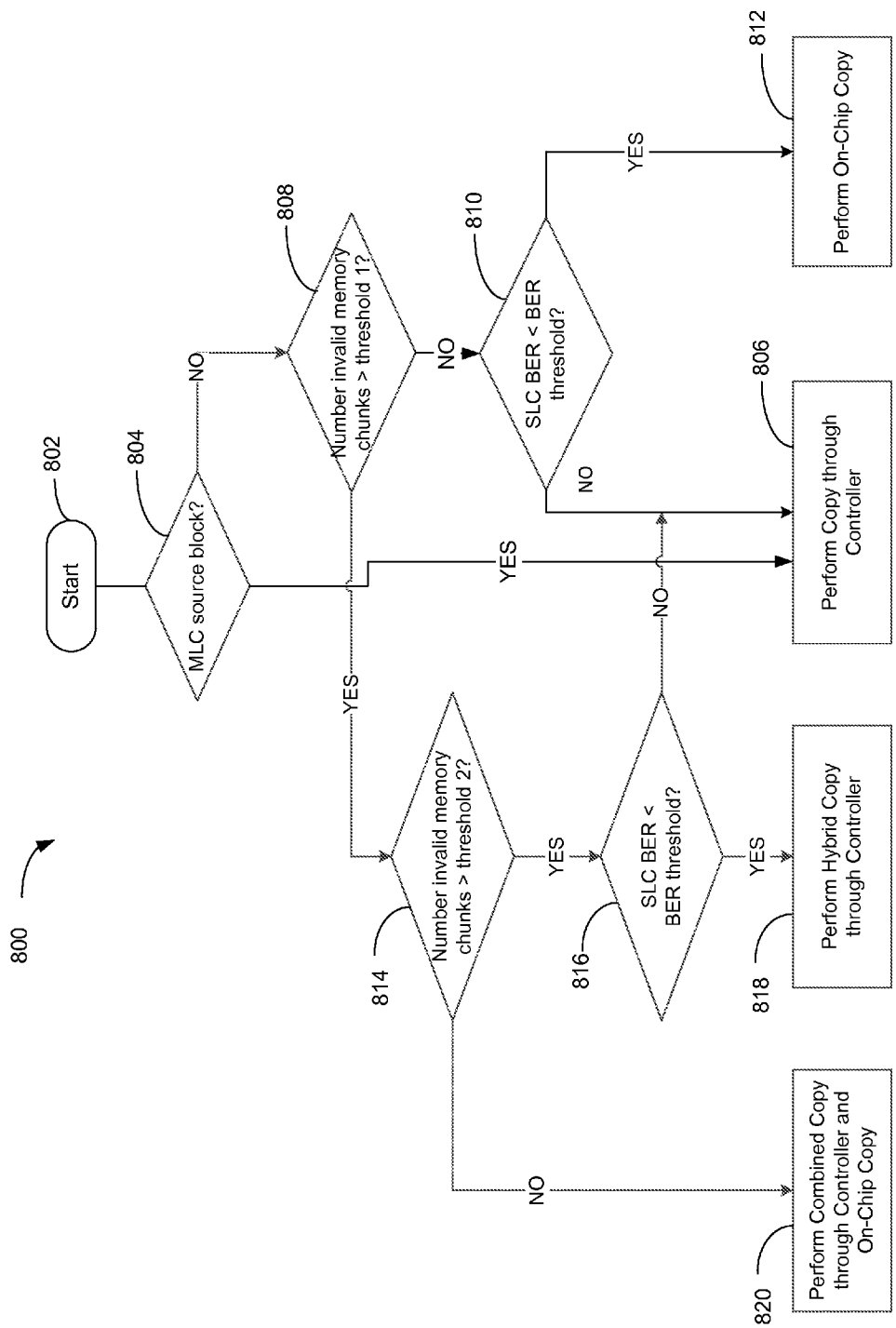
FIG. 8 is a flow diagram of an example method that may be implemented by the memory system of FIG. 2 that conditionally employs the data relocation methods described with reference to FIGS. 4 to 7.

FIG. 8 is a flow diagram of an example method 800 that may be implemented in the storage device 102 of FIG. 1 to facilitate the relocation of data between memory blocks of memory 108. The method 800 conditionally executes methods described with reference to FIGS. 4-7 to effectuate the relocation of data. One or all of the method steps may be performed by memory controller 106 of FIG. 1. Functionality ascribed to of the method steps may be performed by hardware, by the execution of software or any combination thereof. In an embodiment, processor 202 (FIG. 2) may execute instructions stored in controller ROM 206 to cause the relocation of data. Separately, processor 202 may operate one or more hardware components to cause the relocation of data.

At step 802, memory controller 106 may receive an indication to determine if data from memory chunks of pages in a memory block need to be relocated. The indication may be received in response to the completion of a write operation to a page in the memory block. The indication may also be received in response to the expiration of a periodic timer. In an embodiment where processor 202 executes software instructions to effectuate the relocation of data, at step 804, processor 202 may determine if the pages selected for relocation of valid data belong to an MLC memory block or SLC memory block.

In response to determining that the block is an MLC type block, for example 210-1, processor 202 may execute the method steps associated with step 806, in an embodiment. At step 806, an available MLC type memory block may be identified. An available MLC type memory block is one whose pages contain no valid data, for example 210-M. At step 806, processor 202 may determine if the available MLC type memory block is erased. In response to determining that the available MLC type memory block is not erased, processor 202 may cause the erasure of the available MLC type block. Erasure may be effectuated by operating the programming circuit 220 of FIG. 2.

In an embodiment, at step 806, the contents of the block targeted for relocation, example MLC memory block 210-1, may be read into controller RAM 204. Processor 202 may execute software instructions that cause the reading circuit 218 to read the contents of the pages of the MLC memory block 210-1 into controller RAM 204. Processor 202 may identify data associated with invalid pages in the contents of the controller RAM 204. Processor 202 may overwrite the data associated with invalid pages with data associated with valid pages. Thus, in effect, the valid pages within the block are relocated. In an embodiment, replacement of data may be performed to create a contiguous group of pages with valid data. At step 606, references in the logical to physical address table 216 may be updated to point to the new page locations for the valid data. Processor 202 may instruct ECC engine 214 to compute a new ECC for the relocated contents of the memory block. Processor 202 may cause the relocated data to be copies to the transfer data latch (XDL) 224 and instruct the programming circuit 220 to write the data in the XDL 224 to the previously identified and erased available MLC memory block 210-M for example. Processor 202 may mark the MLC memory block 210-1 as being available to be erased. Generally, the method steps 806 may correspond to the copy through controller method described with reference to FIG. 4.

Returning back to step 804, in response to determining that data selected for relocation is stored in memory chunks of an SLC memory block, for example 208-1, memory controller 106 may identify the number of memory chunks with invalid data and compare the number with a first threshold at step 808. In response to determining that the number is below the first threshold, at step 810, ECC may be computed for data from the memory chunks. The ECC may be recomputed by ECC engine 214. Based on recomputed ECC and the FCC originally stored with the data when the data was first written to the memory chunks, at step a BER may be determined. As previously discussed the BER may correspond to a difference between the recomputed ECC and the original ECC. The BER may be compared to a BER threshold. In response to determining that the BER is less than the BER threshold, data from the memory chunks may be copied to a destination memory block using the steps detailed in the on-chip copy (OCC) method described with reference to FIG. 6.

However, in response to determining the number is above the first threshold, at step 810, the method may branch to step and perform the steps of copy through controller RAM described with respect to FIG. 4. As previously explained, copying the through the controller RAM allows the ECC engine to recover bits in the valid data which are in error.

Returning to step 808, in response to determining that the number of memory chunks with invalid data is above the first threshold, method 800 may branch to step 814 and compare the number of memory chunks with invalid data is below a second threshold. In response to determining that the number of memory chunks with invalid data is above a second threshold, at step 816 a BER may be computed for the memory chunks with valid data. As previously explained, the BER may be calculated by computing the ECC for the valid data in the memory chunks and comparing it with the originally computed ECC when the data was written to the memory chunks. By way of example and without limitation, BER is computed based on the ECC. Other methods of computing BER are contemplated. If the BER is less than a second BER threshold, valid data from memory chunks from the source memory block may be relocated to a destination memory block using the method steps described with reference to FIG. 5.

If at step 814, the number of memory chunks with invalid data is equal to below the second threshold, method 800 branches to step 820 and implements the combined copy through controller and on-chip copy method detailed with reference to FIG. 7.

By way of example and without limitation, in the foregoing discussion, the number of invalid memory chunks and the BER corresponding to memory chunks with valid data are two metrics used to select between the different relocation methods. One skilled in the art will recognize that other metrics may be used to select the appropriate relocation method.

As has been described above, several different methods of relocating data between memory chunks in a memory system are discussed. Some of the methods involve performing computationally intensive ECC checksums using the ECC engine before the data is relocated. Other methods involve using the transfer data latch to perform the relocation which is a relatively inexpensive computation. Still other methods use a combination of the two methods discussed in the paragraph to merge in the transfer data latch ECC check-summed memory chunks from one page with non-ECC check-summed memory chunks from another page. Separately, a method and system that selectively using one of the several methods to relocate data is described. The selection of a method is based on one or more criteria including for example number of invalid memory chunks in a page and BER of the valid data in the memory chunks of a page. By using the BER as a criteria in selecting a method, the computational expensive ECC checksum operation can be skipped when relocating data if the bits in error are below the BER threshold.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Further embodiments can be envisioned by one of ordinary skill in the art after reading the foregoing. In other embodiments, combinations or sub-combinations of the above disclosed invention can be advantageously made. The block diagrams of the architecture and flow diagrams are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A method for relocating data in a memory system comprising a memory and a memory controller, wherein the memory comprises a set of pages wherein each page comprises a set of memory chunks, the method comprising:
   determining by the memory controller that a first page is an SLC type page;
   in response to determining that the first page is an SLC type page, determining by the memory controller a number of memory chunks with invalid data in the first page;
   in response to determining that the number of memory chunks with invalid data in the first page is above a first threshold and above a second threshold, comparing a bit error rate (BER) for the valid data in the set of memory chunks of the first page with a first BER threshold;
   in response to determining the BER is below the first BER threshold, computing an error correcting code (ECC) for valid data in a set of memory chunks of a second page and replacing the invalid data of the first page with valid data from the second page and the computed ECC; and
   relocating the valid data of the second page and the valid data of the first page to a third page, without computing an ECC for valid data in the set of memory chunks of the first page.

2. The method of claim 1 further comprising, in response to determining that the first page is an MLC type page, computing by the memory controller an ECC for the valid data of the first page and relocating the valid data of the first page to the third page.

3. The method of claim 1 further comprising, in response to determining that the number of memory chunks with invalid data in the first page is below a first threshold, comparing the bit error rate (BER) for the valid data in the set of memory chunks with a second BER threshold.

4. The method of claim 3 further comprising, in response to determining that the BER is less than the second BER threshold relocating valid data of memory chunks of the first page to the third page.

5. The method of claim 4 further comprising, in response to determining that the BER is greater than the second BER threshold, computing by the memory controller an ECC for the valid data of the first page and relocating the valid data of the first page to the third page.

6. The method of claim 1 further comprising, in response to determining the BER is below the first BER threshold, computing by the memory controller an ECC for the valid data of the first page and relocating the valid data of the first page to the third page.

7. The method of claim 1 further comprising, in response to determining that the number of memory chunks with invalid data in the first page is above a first threshold and below a second threshold, computing by the memory controller an ECC for the valid data of the first page and relocating the valid data of the first page to the third page and from the third page to a fourth page.

8. An apparatus comprising:
a non-volatile memory, wherein the non-volatile memory comprises a set of pages and a data latch and wherein a page comprises a set of memory chunks; and
a memory controller electrically coupled to the memory wherein the memory controller comprises: a processor, a random access memory (RAM) and an error correcting code (ECC) engine wherein
the RAM is configured to store data;
the ECC engine is configured to determine a ECC; and,
a processor configured to:
determine that a first page is an SLC type page,
determine if a number of memory chunks with invalid data in the first page is above a first threshold and above a second threshold and compare a bit error rate (BER) for the valid data in the set of memory chunks with a first BER threshold; and
if the BER is below the first BER threshold:
read the valid data and invalid data of the first page into the data latch;
cause the ECC engine to compute an ECC for valid data of a second page and store the valid data of the second page in the RAM;
to replace the invalid data in the data latch with valid data from RAM; and
to store the valid data from the data latch into a third page.

9. The apparatus of claim 8 wherein the processor is configured to, in response to determining that the first page is an MLC type page, cause the ECC engine to compute an ECC for the valid data of the first page and store the valid data in the RAM and relocate the valid data from RAM to the third page.

10. The apparatus of claim 8 wherein the processor is configured to, in response to determining that the number of memory chunks with invalid data in the first page is below a first threshold, compare the bit error rate (BER) for the valid data in the set of memory chunks with a second BER threshold.

11. The apparatus of claim 10 wherein the processor is configured to, in response to determining that the BER is less than the second BER threshold, relocate valid data of memory chunks of the first page to the third page.

12. The apparatus of claim 11 wherein the processor is configured to, in response to determining that the BER is greater than the second BER threshold, cause the ECC engine to compute an ECC for the valid data of the first page, store the valid data in the RAM and relocate the valid data from RAM to the third page.

13. The apparatus of claim 8 wherein the processor is configured to, in response to determining the BER is below the first BER threshold, cause the ECC engine to compute an ECC for the valid data of the first page, store the valid data in the RAM and relocate the valid data from RAM to the third page.

14. The apparatus of claim 8 wherein the non-volatile memory is a three dimensional memory.

15. A method for relocating data in a memory system comprising a non-volatile memory and a memory controller, wherein the non-volatile memory comprises a set of pages wherein each page comprises a set of memory chunks, the method comprising:
identifying a first page based on determining that the density of memory cells comprising the first page corresponds to a first density, wherein the first page comprises valid and invalid data stored in a set of memory chunks;
computing by the memory controller an error correcting code (ECC) for valid data stored in a second page and storing the ECC with the valid data;
merging the valid data of the first page with the valid data from the second page; and
storing the merged data in a third page.

16. The method of claim 15 wherein computing the ECC is in response to determining that the invalid data in the first page is above a first threshold and above a second threshold.

17. The method of claim 16 wherein in response to determining that the invalid data in the first page is above a first threshold and above a second threshold, comparing a bit error rate (BER) for the valid data in the first page with a first BER threshold.

18. The method of claim 15 wherein in response to determining that the density of memory cells comprising the first page corresponds to a second density computing by the memory controller an ECC for the valid data of the first page and relocating the valid data of the first page to the third page.

19. The method of claim 18 further comprising, in response to determining that the number of memory chunks with invalid data in the first page is above a first threshold and below a second threshold, computing by the memory controller an ECC for the valid data of the first page and relocating the valid data of the first page to the third page and from the third page to a fourth page.

20. The method of claim 15 wherein the non-volatile memory is a three dimensional memory.

* * * * *